United States Patent [19]

Oettel

[11] 4,326,663
[45] * Apr. 27, 1982

[54] PYROELECTRIC DETECTOR

[75] Inventor: Friedrich H. Oettel, Daytona Beach, Fla.

[73] Assignee: Eltec Instruments, Inc., Daytona Beach, Fla.

[*] Notice: The portion of the term of this patent subsequent to Aug. 19, 1997, has been disclaimed.

[21] Appl. No.: 118,796

[22] Filed: Feb. 4, 1980

Related U.S. Application Data

[63] Continuation of Ser. No. 925,991, Jul. 10, 1978, Pat. No. 4,218,620.

[51] Int. Cl.³ ............................................ H01L 21/58
[52] U.S. Cl. .................................. 228/123; 228/180 A
[58] Field of Search ................... 228/180 A, 179, 188, 228/123; 29/589; 357/68

[56] References Cited

U.S. PATENT DOCUMENTS

| | | | |
|---|---|---|---|
| 3,449,642 | 6/1969 | Ortner et al. | 357/68 |
| 3,513,312 | 5/1970 | Weiner | 250/338 |
| 4,183,126 | 1/1980 | Ikeno et al. | 228/123 X |
| 4,218,620 | 8/1980 | Dettel | 250/338 |

FOREIGN PATENT DOCUMENTS

| | | |
|---|---|---|
| 620411 | 3/1949 | United Kingdom . |
| 790318 | of 0000 | United Kingdom . |
| 992588 | 5/1965 | United Kingdom . |
| 1233565 | of 0000 | United Kingdom . |
| 1290990 | of 0000 | United Kingdom . |

Primary Examiner—Gil Weidenfeld
Assistant Examiner—K. J. Ramsey
Attorney, Agent, or Firm—Christel, Bean & Linihan

[57] ABSTRACT

A pyroelectric detector comprising a wafer of pyroelectric material, means for collecting electrical charge indicative of energy absorbed by the wafer, electrical means for removing and processing the collected charge, a base defining at least one supporting surface, and a flexible suspension for supporting the wafer in spaced relation to the supporting surface. The suspension includes a plurality of link elements each in the form of a thin metal wire fixed to the supporting surface and to a surface of the wafer and located around the periphery of the wafer. Each link preferably has a shape like an arch with both ends fixed to the supporting surface and the wafer surface fixed to the arch between the ends thereof. The link elements have sufficient strength to hold the wafer in spaced relation to the supporting surface, and the links have sufficient flexibility to absorb shock and vibration forces and to compensate for different coefficients of thermal expansion of said wafer and said supporting surface.

6 Claims, 6 Drawing Figures

PYROELECTRIC DETECTOR

This is a continuation of application Ser. No. 925,991 filed July 10, 1978, now U.S. Pat. No. 4,218,620.

BACKGROUND OF THE INVENTION

This invention relates to the art of pyroelectric transducers, and more particularly to a new and improved pyroelectric detector having a high degree of isolation from detrimental environmental effects.

One area of use of the present invention is in infrared radiation detectors, although the principles of the invention can be variously applied. A basic pyroelectric detector comprises a wafer of pyroelectric material and electrodes on surfaces of the wafer to collect the electrical charge output indicative of energy absorbed by the wafer. The wafer must be mounted or supported during use, and this should be done in a manner isolating the pyroelectric wafer from adverse environmental influences such as shock and vibration forces and undesirable temperature effects.

SUMMARY OF THE INVENTION

It is, therefore, a primary object of this invention to provide a new and improved pyroelectric detector.

It is a more particular object of this invention to provide a new and improved mounting of a pyroelectric wafer to a supporting base.

It is a further object of this invention to provide such a mounting which reduces the exchange of absorbed energy between the pyroelectric wafer and the supporting base.

It is a further object of this invention to provide such a mounting which compensates for different thermal coefficients of expansion between the pyroelectric wafer and supporting base.

It is a further object of this invention to provide such a mounting which reduces the effects of shock and vibration from the supporting base to the pyroelectric wafer.

It is a further object of this invention to provide such a mounting which minimizes the transmission of sudden temperature changes in other parts of the detector to the pyroelectric wafer.

It is a further object of this invention to provide a new and improved method of mounting a pyroelectric wafer to a supporting base.

The present invention provides a pyroelectric detector comprising a wafer of pyroelectric material having a first surface portion adapted to be disposed toward incident radiant energy and another surface portion, one or more electrodes on the wafer for collecting electric charge indicative of energy absorbed by the wafer, means defining at least one supporting surface, and flexible suspension means for supporting the wafer in spaced relation to the supporting surface. The suspension means has sufficient strength to hold the wafer in spaced relation to the supporting surface and has a degree of flexibility sufficient to absorb shock and vibration forces and to compensate for different coefficients of thermal expansion of the wafer and the supporting surface. The flexible suspension means comprises at least one link element fixed at spaced locations therealong to the supporting surface and to the other surface portion of the wafer, and typically a plurality of links are provided around the perimeter of the wafer. Each link preferably has a shape like an arch wherein both ends are fixed to the supporting surface and an intermediate portion is fixed to the wafer surface. Each link can be in the form of a thin metal wire bonded at two spaced locations to the supporting surface by a method using ultrasonic bonding or thermocompression bonding and bonded to the wafer surface by a suitable adhesive means.

The foregoing and additional advantages and characterizing features of the present invention will become clearly apparent upon a reading of the ensuing detailed description together with the included drawing wherein:

BRIEF DESCRIPTION OF THE DRAWING FIGURES

DETAILED DESCRIPTION OF AN ILLUSTRATIVE EMBODIMENT

In a basic pyroelectric detector for use in detecting infrared radiation and the like, a wafer of pyroelectric material has a surface adapted to be disposed toward the incident radiant energy, at least two electrodes are provided on the wafer for collecting electric charge indicative of energy absorbed by the wafer and suitable electrical means remove and process the collected charge. During use the wafer must be held or supported, and typically the wafer is mounted on a surface in the detector device. It is desired to store absorbed energy in the wafer as long as possible to increase the thermal time constant of the detection device so as to enhance the low frequency response of the detector. This, in turn, requires a reduction in the exchange of absorbed energy from the pyroelectric wafer to the mounting surface and also from the mounting surface to the pyroelectric wafer. In addition, it is desired to minimize the piezoelectric response of the pyroelectric wafer which arises from a mechanical coupling of external force through the mounting to the wafer. This, in turn, requires that the mechanical contact area between the wafer and the mounting be minimized. It also is desired that there be a maximum absorption of energy per unit volume of the pyroelectric wafer, and this is accomplished by having the wafer as thin as possible. This, in turn, requires that the wafer be isolated from forces encountered by the detector during manufacture and use.

In accordance with the present invention, there is provided a flexible suspension means for supporting the wafer of pyroelectric material in spaced relation to a supporting surface of the detector. The suspension means is fixed to the supporting surface and to a surface portion of the wafer. The suspension means has sufficient strength to hold the pyroelectric wafer in spaced relation to the supporting surface and has a degree of flexibility sufficient to absorb shock and vibration forces and to compensate for different thermal coefficients of expansion of the wafer and the supporting surface. The suspension means has a relatively small contact area, preferably approaching point contact, with the wafer and/or the supporting surface. The suspension means comprises at least one link element fixed at spaced locations therealong to the supporting surface and to the surface portion of the pyroelectric wafer. Preferably a plurality of link elements are provided around the periphery of the wafer. Each link is in the form of a thin metal wire, and each link has a shape like an arch wherein both ends of the link are fixed to the supporting surface and the link is fixed to the surface portion of the wafer at a location between the ends of the link. Each link is bonded at two spaced locations to the supporting surface by a method using ultrasonic bonding or thermocompression bonding and is bonded to the wafer surface by suitable adhesive means.

Figure 1:
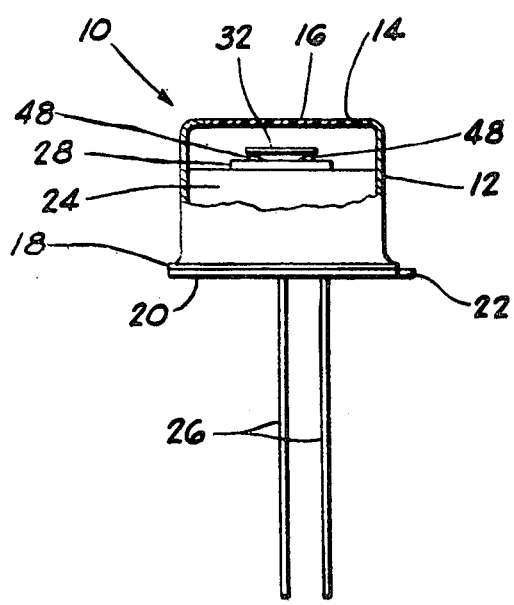
FIG. 1 is a side elevational view with parts removed of a pyroelectric detector according to the present invention.

Referring now to FIG. 1, a pyroelectric detector 10 includes a housing 12 which is generally hollow cylindrical in shape and preferably of metal such as nickel-plated steel. One end face of housing 12 is provided with an opening 14 which is of a size occupying a substantial portion of the area of the end face housing 12 in the device shown and serves to admit radiant energy to be detected into the interior of housing 12. Opening 14 is sealed closed by a sheet or disc 16 of transparent material, for example germanium, which transmits the radiant energy, i.e. infrared radiation, to the interior of housing 12. Opening 14 can of course have other shapes and relative sizes. The opposite end of housing 12 is formed to include a peripheral flange 18, and an annular rim 20 of metal having an outer diameter equal to the outer diameter of flange is fixed such as by welding to the flange 18. Rim 20 is provided with a tab or projection 22 to facilitate alignment during installation and manufacture.

Figure 3:
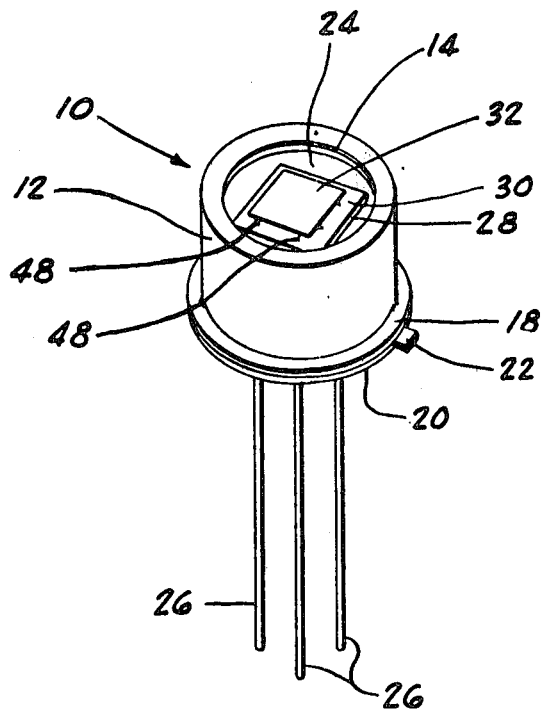
FIG. 3 is a perspective view of the detector of FIG. 1 rotated slightly about a vertical axis in a clock-wise direction as viewed in FIG. 3.

A portion of the interior region of housing 12 extending axially inwardly from flange 18 is occupied by a generally cupshaped metal header 24 which terminates at one end in annular rim 20 and at the opposite end in a surface located axially between flange 18 and surface 14 and which is disposed in a plane substantially perpendicular to the longitudinal axis of housing 12. This surface of header 24 includes at least two apertures or openings (not shown) through which electrical conductors or pins 26 extend for making electrical connections to device components in a manner which will be described. Three leads or pins 26 extend outwardly from the end of housing 12 containing flange 18 as shown in FIG. 3, and the leads are disposed substantially parallel to the longitudinal axis of housing 12. Intermediate segments of leads 26 are held within the interior of the header 24 by a glass seal contained therein which also insulates these segments of leads 26 from header 26.

A plate or pad 28 of relatively rigid material is fixed to the end surface of header 24, and plate 28 defines a supporting surface 30 which faces opening 14 and is disposed in a plane substantially perpendicular to the longitudinal axis of housing 12. The pad or platform 28 may be of either electrically conductive or insulative material, and preferably pad 28 is of alumina or gold-plated for a purpose which will be described.

The pyroelectric detector 10 further comprises a sensing element of pyroelectric material in the form of a wafer 32 located in housing 12 inwardly of and in registry with opening 14. Wafer 32 is relatively thin and in the device shown is of rectangular configuration, in particular square. Other shapes or configurations can of course be employed. Wafer 32 has a first surface portion 34 adapted to be directed toward incident radiant energy and another surface portion 36. In particular, surface 34 is disposed so as to face opening 14 and surface 36 faces the supporting surface 30 of pad 28. The surfaces 34,36 are substantially planar, disposed in substantially parallel planes, and are separated by a marginal or peripheral edge surface 38.

Wafer 32 is of an energy absorbing and responding material which absorbs energy and provides an electrical charge output indicative of the energy. The pyroelectric wafer 32 typically is of a crystalline material wherein absorbed radiant energy causes an alteration or modification in the crystal lattice structure of the material which, in turn, gives rise to a flow of electrons and hence an electrical current output indicative of the absorbed energy. Lithium tantalate, $LiTaO_3$, is a crystalline material commonly employed in pyroelectric detectors. Other materials can be used; for example tri-gylcine sulphate, strontium barium niobate and other crystalline materials and non-crystalline materials such as lead zirconate titanate, lantham-doped lead zirconate titanate and other non-crystalline materials. By way of illustration, in a typical device wafer 32 has a length of about 2.5 millimeters, a width of about 2.5 millimeters, a thickness of about 0.03 millimeters and a weight of about 0.0015 grams.

Figure 4:
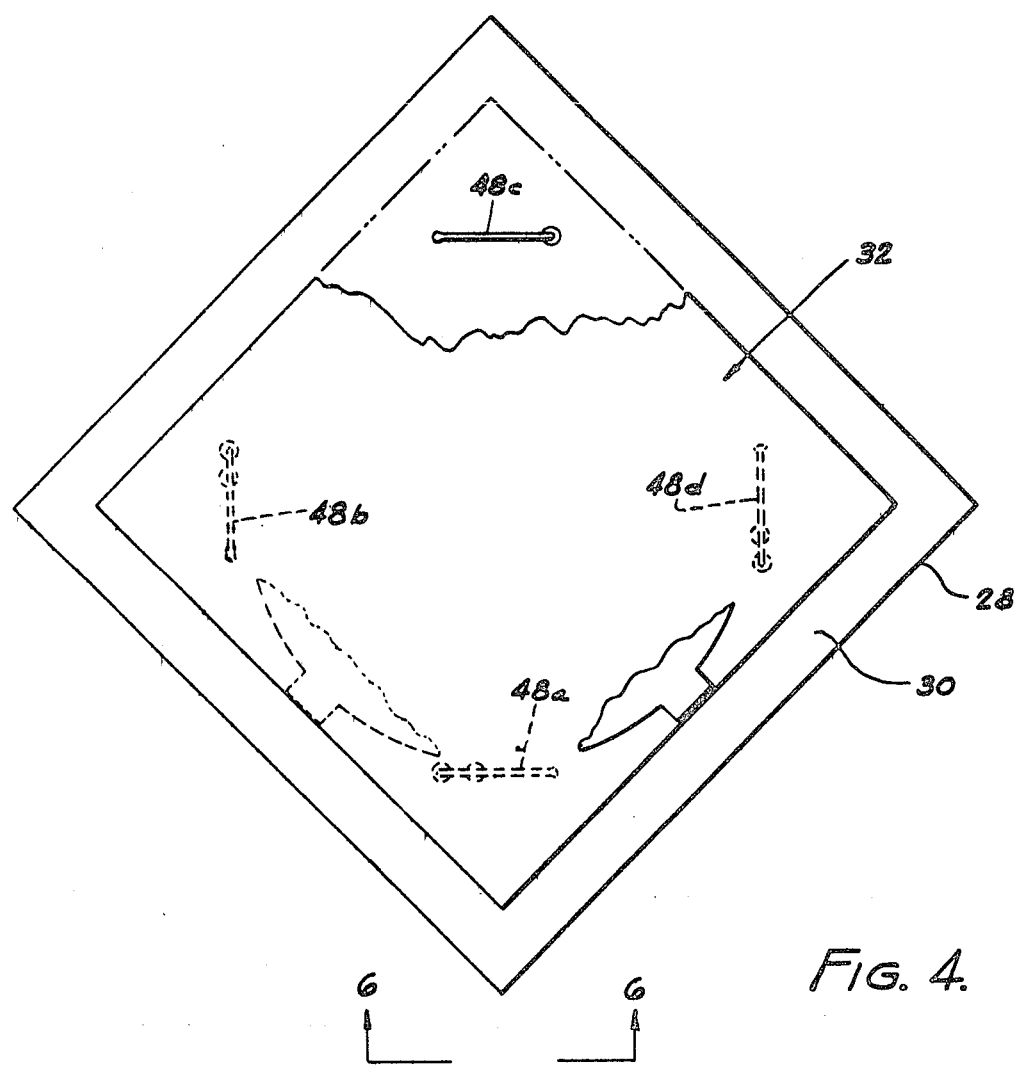
FIG. 4 is an enlarged plan view with parts removed showing the supporting base of the detector of FIG. 1 with the pyroelectric detector held in spaced relation to the base by a flexible suspension according to the present invention.
Figure 5:
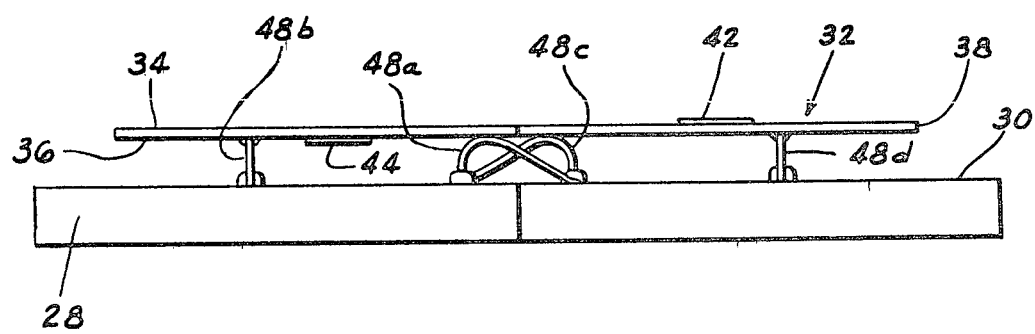
FIG. 5 is a side elevational view of the arrangement of FIG. 4.

In order to collect or gather electric charge developed by pyroelectric wafer 32 in response to incident radiant energy, the pyroelectric detector is provided with means for collecting such charge in the form of a pair of electrodes 42,44 on surfaces of wafer 32 as shown in FIGS. 4 and 5. In particular, electrode 42 is provided on surface 34 of the wafer 32, and electrode 44 is provided on the opposite surface 36 of the wafer. Each of the electrodes 42,44 is shown fragmentarily in FIGS. 4 and 5 for simplicity in illustration. Typically, each electrode is a thin metal film or coating, for example nickel applied by vacuum deposition for techniques, on a substantial portion of the corresponding surface of the wafer. As to the nature of the material and the thickness of the electrode film on the wafer surface disposed toward the incident radiant energy, the electrode must be transparent in the optical wavelength region where the wafer is absorbent, or the electrode must be absorbent in the optical wavelength region where the wafer is transparent. Also, each electrode must have sufficient electrical conductivity to transfer of the collected charge.

By way of example, in an illustrative device, a separate electrical conductor or lead (not shown) would be connected to each electrode, one of these conductors would be connected also to the header 24 (one of the terminal pins 26 being connected to the header 24) serving as an electrical reference or ground, and the other of these conductors would be connected also to one terminal of a high megohm resistor (not shown) which is mounted on the header 24. The other resistor terminal would be connected to the header 24 serving as an electrical reference or ground. The resistor terminal connected to the wafer electrode also is connected to the gate terminal of a field effect transistor (not shown) which also is mounted to header 24, or located on the surface thereof. The source and drain terminals of the field effect transistor connected to corresponding terminals located within detector 10, and these terminals in turn are connected to corresponding ones of the leads 26. The third lead 26 is connected to the header 24 for providing the electrical reference or ground. The resistor-field effect transistor serves as a high input impedance preamplifier for the signal output of pyroelectric wafer 32.

Figure 2:
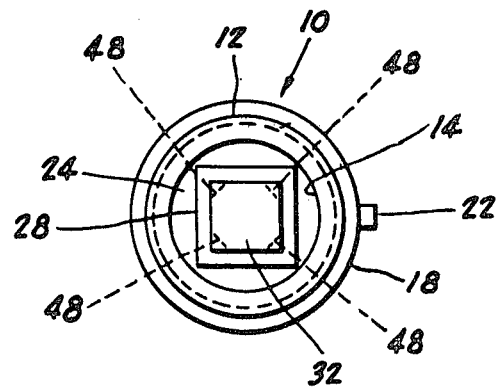
FIG. 2 is a top plan view thereof.

In accordance with the present invention there is provided flexible suspension means, generally designated 48 in FIGS. 1-3, for supporting the sensing elements or wafer 32 in spaced relation to supporting surface 30 of platform 28. The suspension means 48 is connected to supporting surface 30 and to the surface 36 of wafer 32. The suspension means 48 has sufficient strength to hold pyroelectric wafer 32 in spaced relation to supporting surface 30, and the suspension means has a degree of flexibility sufficient to absorb shock and vibration forces and to compensate for different thermal coefficients of expansion of wafer 32 and supporting surface 30. The supporting means 48 has a relatively small contact area with wafer 32 or supporting surface 30, preferably with both, and the contact area approaches or approximates point contact. The supporting means 48 comprises at least one link element, preferably a plurality of link elements 48a–48d as shown in FIGS. 4 and 5, fixed at spaced locations along the link to the supporting surface 30 and to the surface 36 of pyroelectric wafer 32. In the device shown wherein wafer 32 is of rectangular configuration, having a link element adjacent each corner of the rectangular wafer for a total of four links 48a–48d is preferred. Providing three link elements in association with a rectangular pyroelectric wafer gives satisfactory performance. Other shapes or configurations of pyroelectric wafers may allow a different number of links to be employed.

Each of the link elements 48a–48d is in the form of a thin metal wire, preferably of gold or aluminum. These two metals are soft enough to be workable to form the links of the suspension, and these metals have sufficient flexibility to satisfy the requirements for the suspension. Also, these metals are preferred for wire bonding techniques which will be described in detail presently. The minimum diameter of the wire is a function of the required strength of the suspension for supporting the sensing element wafer 32, and the maximum diameter of the wire is a function of the required degree of flexibility in the suspension. Satisfactory results are obtained with a minimum diameter of about 0.0007 inch a maximum diameter of about 0.002 inch or 2 mils, and a typical diameter of about 0.001 inch.

Each of the link elements 48a–48d as shown in FIGS. 4 and 5 has a shape like an arch wherein both ends of the link are fixed to supporting surface 30 and the link is fixed to surface 36 of pyroelectric wafer 32 at a location between the ends of the link. As shown in detail in FIG. 6 which illustrates one link element 48a, one end of the thin metal wire 50a which defines the link element is bonded at one end to surface 30 of mounting platform 28 is a manner forming a bulbous-shaped body 52a at the end of the wire bonded to surface 30 as will be described in detail presently. The wire is shaped like an arch in a manner including a first section extending outwardly away from surface 30 toward wafer 32 and along a curved path, a second or intermediate section including a part thereof which is disposed in a plane substantially parallel to the plane of supporting surface 30, and a third section extending from the intermediate section in a direction returning toward surface 30. The other end of the wire 50a which terminates the third section is bonded to surface 30 in a manner defining a region 54a as will be described in detail presently.

In the device shown, the distance along wire 50a from the end at region 54a to the center of the intermediate section or tip of the arch is greater than the distance from the tip of the arch to the opposite end of wire 50a. By way of example, in an illustrative device, wire 50a has a diameter of about 1.0 mil, body 52a has a diameter of about 4.0 mil and a height of about 2.0 mil, the height of the arch is about 8.0 mil measured along the perpendicular distance between surfaces 30 and 36, and the length of the arch is about 20 mils measured along surface 30 from the center of body 52a to the center of region 54a. Each of the link elements 48a–48d is disposed in a plane substantially perpendicular to the plane of surface 30, and all of the links are of substantially the same height or distance measured normal to surface 30.

Figure 6:
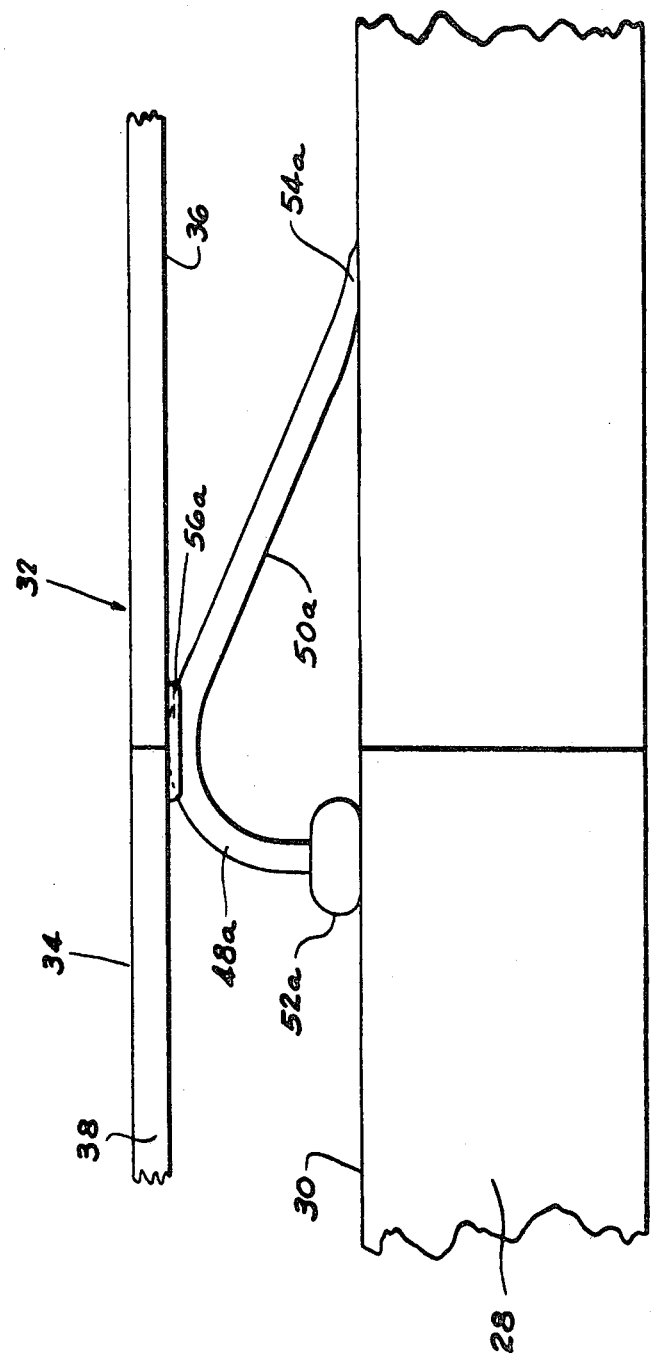
FIG. 6 is a fragmentary elevational view taken about on line 6—6 in FIG. 4.

After the link elements all have been secured to supporting surface 30, the sensing element wafer 32 then is placed on and secured to the links 48. As shown in FIG. 6, a quantity or region 56a of adhesive is placed on the outer tip of each link element, and the surface 36 of pyroelectric wafer 32 is placed in contact with the regions of adhesive so as to be bonded thereby. One form of adhesive found to provide satisfactory results is an epoxy cement available commercially under the designation Epo-Tek H20 E.

Thus each link element, for example link 48a detailed in FIG. 6, provides a suspension having two legs, the legs being connected to spaced locations on surface 30 of mounting pad 28 and to a single or common location on surface 36 of pyroelectric wafer 32. While the link elements 48 have been described as having a shape like an arch, each link formed by the relatively thin wire also may be viewed as a loop in conjunction with the portion of surface 30 between the ends of the wire. In the device shown, mounting pad 28 define a single supporting surface 30 to which each of the plurality of links 48 is connected. Other arrangements can be employed, for example having one leg of each link connected to the supporting surface 30 and the other leg to the adjacent surface portion of header 24, or having a plurality of pads on the header defining a corresponding plurality of supporting surfaces with each link being connected to a corresponding one of the supporting surfaces, to mention just two examples.

In use, detector 10 is installed at a location where it is desired to sense or detect radiant energy, in particular infrared radiation. In response to radiant energy incident upon surface 34 of the sensing element wafer 32, an electrical charge output is developed on electrodes 42,44 according to the pyroelectric effect as previously described. The resulting flow of electrical current in a circuit connected to electrodes 42,44 is utilized to provide output information regarding the infrared radiation. Infrared detectors find wide application in process controls, industrial safety measures, and intrusion detectors or alarms, to mention just a few.

The flexible suspension according to the present invention for supporting the pyroelectric sensing element 32 in spaced relation to the base or mounting platform 28 provides many desirable results and advantages. The flexible suspension provided by links 48 reduces the effects of shock and/or vibration from the mounting platform 28 to the sensing element wafer 32. Pyroelectric materials also have piezoelectric properties which are unwanted in devices of this type. Shock and/or vibration forces can create piezoelectric signals in the pyroelectric sensing element which will interfere with or obscure the desired pyroelectric signals containing information as to the infrared radiation being detected. The flexible suspension according to this invention serves to absorb shock and/or vibration forces thereby minimizing the undesirable influence of these forces on pyroelectric wafer 32. In this connection, forces leaving the surface 30 of platform 28 are transmitted along the arches defined by the links 48 rather than being transmitted in a direction perpendicular to surface 36 of wafer 32. Also mechanical coupling of external forces to sensing element 32 is minimized due to the relatively small contact area between suspension 48 and wafer 32 or supporting surface 30, preferably both.

The flexible suspension provided by links 48 compensates for different thermal coefficients of expansion between the sensing element wafer 32 and the mounting platform 28. If the wafer 32 were instead rigidly attached to the mounting platform 28, the difference in thermal expansion between the sensing element wafer 32 and the mounting platform 28 would introduce stress into the pyroelectric wafer 32 causing unwanted piezoelectric signals and even breakage of the wafer. This is avoided, however, by the compensation provided by the flexible suspension according to this invention.

The flexible suspension provided by links 48 reduces the exchange of absorbed energy in both directions between the sensing element wafer 32 and the mounting platform 28. Absorbed energy should be stored or remain in pyroelectric wafer 32 for as long a time as possible to increase the thermal time constant of the detection device so as to enhance the low frequency response of the detection device. Sudden changes in temperature of parts of the detection device, other than the sensing element wafer, should be transmitted to the wafer as little as possible. The foregoing is accomplished by links 48 being in the form of thin or fine metal wire and which hold pyroelectric wafer 32 in spaced relation to the surface 30 of base 28. The links 48 serve to provide the minimum possible mechanical link or connection in terms of exchange of absorbed energy.

The flexible suspension according to the present invention is particularly advantageous for use in pyroelectric detectors for supporting the relatively thin sensing element of pyroelectric material which is in the form of a wafer. The flexible suspension may be used for supporting other transducing elements of the type wherein an energy input causes a change in an electrical charactistic of the element and which element is relatively thin, susceptible to damage due to mechanical stresses, and susceptible to changes in its electrical characteristics caused by unwanted thermal and mechanical influences.

The flexible suspension is made or fabricated according to the following method of the present invention. According to one aspect of the method, ultrasonic waves bonding techniques are employed. The subassembly of the detector device including the mounting platform or pad 28 is held or supported in a suitable manner relative to an ultrasonic wire bonding machine. One machine found to perform satisfactorily in this method is commercially available from Kulicke and Soffa of Horsham, Pennsylvania. The ultrasonic wire bonding is performed under conditions of force, vibration and temperature, typically from about 18 to about 30 grams at about 100° C.

The method is used to form and provide each link element 48 having a shape like an arch or the supporting surface 30 by securing the two ends of the arch-like link 48 to the supporting surface 30 and disposing the link so as to extend outwardly from the supporting surface. In particular, a length of thin metal wire, gold or aluminum, is provided, and a portion of the wire is bonded to supporting surface 30 at a first location. Surface 30 preferably has a coating of gold or aluminum to enhance the ultrasonic bonding technique. The gold or aluminum wire is held in a capillary tube of the ultrasonic bonding machine, and the machine forms a small ball or sphere on the exposed tip or end of the wire. The capillary tube is disposed generally perpendicular to surface 30 and then is moved toward surface 30 to place the ball or sphere in contact with the first point or location on the surface to which the end of the wire is to be ultrasonically bonded. As the sphere contacts surface 30, vibration at ultrasonic frequency, and some force and heat are applied to the ball or sphere thereby forming the bond region designated 52a in FIG. 6, the ultrasonic vibration being primarily responsible for the formation of the bond.

After the bond including region 52a is formed the capillary tube of the ultrasonic bonding machine is manipulated by the operator to direct the adjacent portion of the length of wire 50a along a path first away from surface 30 and then toward surface 30 in a manner defining the arch-like shape of the link 48 and then returning a portion of the wire to the surface 30. As shown in FIG. 6, the first portion of the path is curved, the intermediate portion includes a part which is substantially parallel to the plane of surface 30, and the remaining portion is of larger length and lesser curvature as compared to the first portion. When the wire 50a is again in contact with surface 30, the machine bonds the wire to surface 30 forming the bond region 54a and under similar conditions of ultrasonic vibration. This bond is at a location or surface 30 spaced from the bond 52a. Simultaneously, the machine severs the wire in the capillary tube from wire length 50a and proceeds to form another sphere on the wire end in readiness for the next bond. In forming the link 48a according to the foregoing technique, the wire length 50a is guided along the aforementioned path through a plane substantially perpendicular to the plane of surface 30.

The same procedure is repeated to form the required number of links 48, for example four adjacent each corner of a rectangle in the device shown. In carrying out this method, the links 48 are formed of uniform height in a direction normal to surface 30. When all the links are formed, a droplike quantity 56a of the aforementioned adhesive is placed on the tip or outermost surface portion of each link. Then the wafer 32 of pyroelectric material with the electrodes thereon is positioned and placed on the links 48 so as to be supported thereby with the wafer surface 36 contacting the bodies 56 of epoxy cement. Positioning and placement of the relatively small wafer 32 can be performed using a vacuum pick or tweezers. The entire subassembly of platform 28, wafer 32 and flexible suspension can be heated for a time and at a temperature sufficient to cure the epoxy adhesive bonding the links 48 to surface 36 of wafer 32.

The flexible suspension can be made according to a similar procedure substituting thermocompression bonding for ultrasonic bonding. A thermocompression wire bonding machine found to perform satisfactorily also is available commercially from Kulicke and Soffa of Horsham, Pennsylvania. The thermocompression bonding is performed under conditions of force and temperature, typically about 500 grams at about 450° C. The force and heat bond the wire to surface 30 as contrasted with ultrasonic vibration. The manipulative steps and procedure are substantially the same as described in connection with the ultrasonic bonding method.

As an alternative, in carrying out the above method using either ultrasonic or thermocompression bonding techniques, rather than forming separate link elements with severing of the wire after completion of each link, the plurality of links can be formed of a continuous length of wire wherein the wire sections between adjacent links would lie along the portions of the supporting surface adjacent the links. In addition, as previously pointed out, in carrying out the foregoing methods one leg of a link can be connected to the supporting surface and the other leg to the adjacent surface portion of the header or each link can be connected to a corresponding one of a plurality of supporting surfaces. As an alternative to the ultrasonic and thermocompression bonding procedures, each link 48 can be secured to a supporting surface or surfaces, such as to platform 28 at regions 52 and 54 shown in FIG. 6, by suitable adhesive techniques.

It is therefore apparent that the present invention accomplishes its intended objects. While several embodiments of the present invention have been described in detail, this is for the purpose of illustration, not limitation.

I claim:

1. A method of making a pyroelectric detector comprising the steps of:
    (a) providing a supporting means having a supporting surface;
    (b) providing at least one elongated link element having a shape like an arch on said supporting means by securing the two ends of the arch-like link to spaced locations on said supporting surface in a manner providing an area of contact between each end of said link element and said supporting surface at least several times smaller than said supporting surface and disposing the link so as to extend outwardly from said supporting means;
    (c) providing a sensing element of pyroelectric material in the form of a wafer having a first surface portion adapted to be disposed toward incident radiant energy, another surface portion and means on said sensing element for collecting electric charge indicative of energy absorbed by said sensing element; and
    (d) placing said sensing element on said link and securing said other surface portion of said sensing element to the outer portion of said link whereby said sensing element is held by said link in spaced relation to said supporting means.

2. A method according to claim 1, wherein said two ends of said link are secured to said spaced locations on said supporting surface in a manner providing substantially point contact between each end of said link and said supporting surface.

3. A method according to claim 1 further including providing a plurality of said link elements on said supporting means and disposing said link elements to extend outwardly in the same direction from said supporting means.

4. A method of making a pyroelectric detector comprising the steps of:
    (a) providing a supporting means having a supporting surface;
    (b) providing at least one elongated link element having a shape like an arch on said supporting surface by securing the two ends of the arch-like link to spaced locations on said supporting means in a manner providing an area of contact between each end of said link element and said supporting surface at least several times smaller than said supporting surface and disposing the link so as to extend outwardly from said supporting means;
    (c) providing a sensing element of pyroelectric material in the form of a wafer having a first surface portion adapted to be disposed toward incident radiant energy, another surface portion, and means on said sensing element for collecting electric charge indicative of energy absorbed by said sensing element; and
    (d) placing said sensing element on said link and securing said other surface portion of said sensing element to the outer portion of said link whereby said sensing element is held by said link in spaced relation to said supporting means;
    (e) said step of providing said link element on said supporting means comprising providing a thin length of metal wire, bonding a portion of the length of said wire to said supporting means at a first location thereon, directing an adjacent portion of the length of said wire along a path first away from said supporting means and then toward said supporting means in a manner defining said arch-like shape and returning a portion of the wire to said supporting means, and bonding the portion of said wire returned to said supporting means at a second location thereon spaced from said first location.

5. A method according to claim 4, wherein said steps of bonding are performed by ultrasonic bonding.

6. A method according to claim 4, wherein said steps of bonding are performed by thermocompression bonding.

* * * * *